United States Patent [19]

Hurwitt

[11] Patent Number: 4,855,033

[45] Date of Patent: Aug. 8, 1989

[54] CATHODE AND TARGET DESIGN FOR A SPUTTER COATING APPARATUS

[75] Inventor: Steven D. Hurwitt, Park Ridge, N.J.

[73] Assignee: Materials Research Corporation, Orangeburg, N.Y.

[21] Appl. No.: 95,100

[22] Filed: Sep. 10, 1987

Related U.S. Application Data

[63] Continuation of Ser. No. 848,698, Apr. 4, 1986, abandoned.

[51] Int. Cl.[4] .............................................. C23C 14/34
[52] U.S. Cl. ................................ 204/298; 204/192.12
[58] Field of Search ................ 204/192.1, 192.12, 298, 204/298 CS, 298 TS, 298 WH, 298 C

[56] References Cited

U.S. PATENT DOCUMENTS

| | | | |
|---|---|---|---|
| 4,060,470 | 11/1977 | Clarke | 204/298 |
| 4,169,031 | 9/1979 | Brors | 204/298 |
| 4,204,936 | 5/1980 | Hartsough | 204/298 |
| 4,385,979 | 5/1983 | Pierce et al. | 204/298 |
| 4,414,086 | 11/1983 | Lamont, Jr. | 204/298 |
| 4,457,825 | 7/1984 | Lamont, Jr. | 204/298 |
| 4,486,287 | 12/1984 | Fournier | 204/298 |
| 4,517,070 | 5/1985 | Kisner | 204/298 |
| 4,569,746 | 2/1986 | Hutchinson . | |
| 4,572,776 | 2/1986 | Aichert et al. | 294/298 |

FOREIGN PATENT DOCUMENTS

| | | |
|---|---|---|
| 0127272 | 12/1984 | European Pat. Off. . |
| 3411536 | 1/1985 | Fed. Rep. of Germany . |
| 3442206 | 7/1985 | Fed. Rep. of Germany . |
| 2535109 | 4/1984 | France . |
| 1019773 | 1/1986 | Japan .................................... 204/298 |
| 2161837 | 1/1986 | United Kingdom . |

OTHER PUBLICATIONS

Patents Abstracts of Japan, Unexamined Applications, Mar. 13, 1986, vol. 10, No. 63, Kokai-No. 60-200 962.
Patent Abstracts of Japan, Unexamined Applications, Jul. 11, 1985, vol. 9, No. 166, Kokai-No. 60-39 158.

*Primary Examiner*—Nam X. Nguyen
*Attorney, Agent, or Firm*—Wood, Herron & Evans

[57] ABSTRACT

An improved cathode and sputtering target design for sputter coating, permitting operation with larger cathodes and at higher power levels than heretofore possible. The cathode and target assembly includes a cathode body, a target holder, and a sputtering target. The cathode body functions as a magnetic pole piece, a portion of the cooling system, and a mechanical stabilizer for the target. The target holder also provides cooling, by means of cooling passages and by intermeshing cooling means in contact with the target. The sputtering target has an arch-like face that promotes a controlled plastic deformation in a preselected direction, so that heat-induced expansion during operation results in the target being urged into forceful, intimate contact with at least two cooled surfaces.

20 Claims, 2 Drawing Sheets

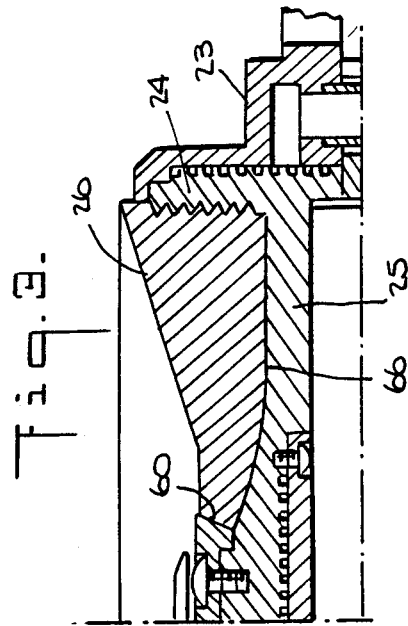
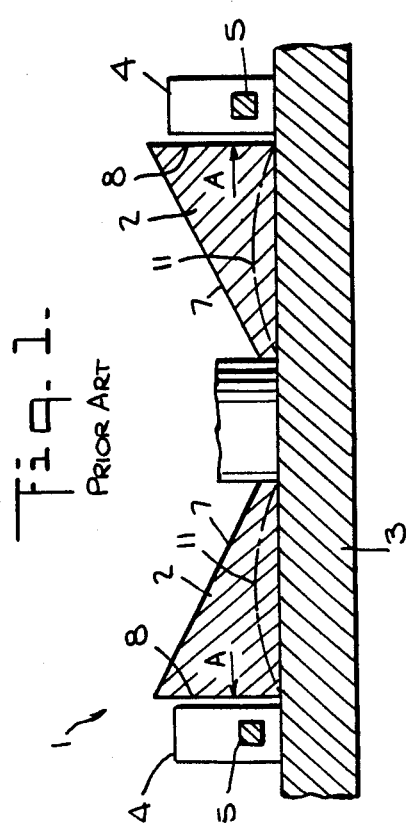
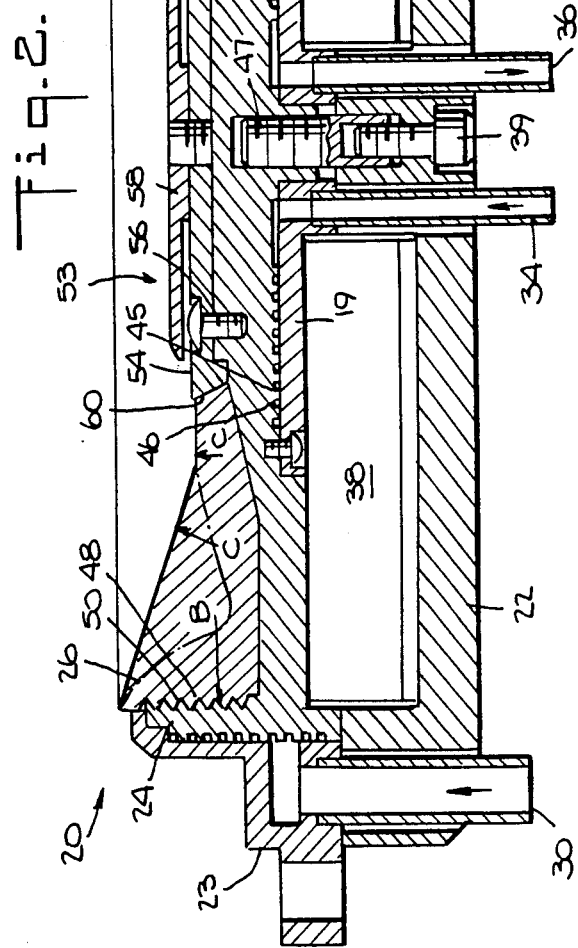

CATHODE AND TARGET DESIGN FOR A SPUTTER COATING APPARATUS

This is a continuation of application Ser. No. 848,698, filed Apr. 4, 1986, abandoned.

BACKGROUND OF THE INVENTION

This invention relates to the field of sputter coating, and more particularly, to the design of the cathode and target assembly for such apparatus.

This application is related to the patent application entitled "Apparatus for Improving the Uniformity of Ion Bombardment In a Magnetron Sputtering System", Ser. No. 095,560, filed Sept. 10, 1987 which is a continuation of application Ser. No. 848,750, filed Apr. 4, 1986 and now abandoned, and of the application entitled "Method and Apparatus for Handling and Processing Wafer-Like Articles", one being Ser. No. 222,327, filed July 20, 1988, which is a continuation of application Ser. No. 112,766, filed Oct. 22, 1987, now abandoned, which is a continuation of application Ser. No. 848,687, filed Apr. 4, 1986 and now abandoned, and the other being application Ser. No. 222,328, filed July 20, 1988 which is a continuation of application Ser. No. 112,777, filed Oct. 22, 1987 now abandoned which is a continuation of application Ser. No. 848,297, filed Apr. 4, 1986 and now abandoned.

Sputtering is an important technique for applying thin films to substrate materials, such as wafers utilized in manufacturing microelectronic components. The process can best be envisioned as a series of steps, occurring in a low-pressure chamber into which a gas, typically argon, has been introduced. A negative potential is applied to a cathode structure, establishing an electric field, and electrons from the cathode collide with argon atoms, creating ions and exciting a glow discharge. Accelerated by the cathode's negative potential, the ions travel parallel to the electric field lines and impact a target, composed of the coating material, carried in the cathode structure. The kinetic energy of these ions is sufficiently high to dislodge some target surface atoms, which then condense on the substrate to form the film.

One technique used in the sputtering art has been the employment of magnetic fields to enhance the ion bombardment of the target. In such apparatus, referred to as magnetron sputtering devices, magnetic means are disposed to induce a relatively strong field in the vicinity of the target face, with the magnetic field lines oriented generally perpendicular to those of the electric field. Electrons emitted from the target face are influenced by the magnetic field so that their path of motion becomes curved, and in effect, the magnetic field "traps" such electrons in the vicinity of the target. The effect of this action is to promote electron-argon collisions close to the target face, maximizing the ion flux bombarding the target. Typical of magnetron sputtering apparatus is the device disclosed in U.S. Pat. No. 4,472,259, assigned to the assignee of the present invention.

From the perspective of the designer of sputtering apparatus, an important consequence of the ion bombardment is target heating. Ejection of a target material atom is only one result of an ion impacting the target surface, and the vast proportion of system input power appears finally as heat in the target. Thus, sputtering cathode systems are sensitive to design changes that call for increased input power, as increases in effective power (power that, for example, increases the deposition rate) entail increases in target heating.

Emerging design criteria specified by users of sputtering equipment call for power requirements that exceed the capacities of conventional apparatus. Several factors combine to produce this situation. First, users commonly specify relatively soft coating materials, such as gold, aluminum, or aluminum alloys. As discussed in more detail below, such materials present particular problems in dealing with target heating. Second, users call for higher deposition rates, to increase productivity and film quality. To achieve such rates requires equipment capable of operating at higher input power levels than are now seen in the art. And in addition, there exists a trend toward ever-larger substrates, requiring cathodes and targets larger than those heretofore produced, creating particular design problems.

These factors, and particularly the latter two, require equipment that departs from conventional designs in dealing with target heating. Yet the art has offered few innovations aimed at dealing with the problems of heat buildup. Moreover, as detailed below, conventional designs inherently limit the ability of a target to withstand the heat buildup of sustained high-power operation. Thus, it was left to the present inventors to address this problem and achieve the solution presented herein.

SUMMARY OF THE INVENTION

It is a broad object of the present invention to provide a sputtering target capable of sustained high-power operation.

A further object of the invention is the provision of a sputtering cathode assembly that effectively cools a target carried therein during high-power operation.

Another object of the invention is a sputtering target that employs controlled deformation to insure effective cooling and retention of sputtering face orientation.

A still further object of the invention is the provision of a sputtering cathode assembly that combines the functions of a magnetic pole piece, a target cooling means, and a mechanical stabilizer for the target.

These and other objects are achieved in the present invention, a cathode and target assembly, that includes a cathode body, a target nest, a sputtering target, and additional support structures. The cathode body is formed of a strong ferromagnetic material formed for enclosing and stablizing the nest and target. Cathode body side walls include means for partially enclosing cooling passages, and the side wall also may serve as a magnetic pole piece.

A target nest, composed of heat-conductive material, is received within a well in the cathode body. The outer periphery of the nest and the central area of its back side include means for partially enclosing coolant passages, the former in registration with cathode body enclosing means, to form coolant channels at the interface between the nest and the body, and other channels in the next central area each of which is in fluid communication with coolant inlet and outlet means.

The additional support structures include magnet means, a cap, formed of rigid, nonferromagnetic material, and cooling means.

A target, composed of coating material, is similarly received within a central cavity in the face of the the nest. The inner periphery of the nest and the outer rim of the target carry cooling means, in the form of intermeshing projections and recesses. In a preferred embodiment, these means are in the form of a helical thread extending the vertical length of the nest inner periphery. The back face of the target and the front face of the nest form complementary surfaces, with the target back face having a convex, arch-like shape, formed as either a convex curved surface or as two surfaces whose intersection encloses an obtuse angle, the apex of which projects outward from the target back face. In one embodiment, one surface is planar, generally normal to the cathode assembly axis, and the other is conical. The target back face thus permits a controlled deformation of the target under expansive stresses imposed by heat buildup, such that the target will be urged into forceful, intimate contact with the cooled surfaces of the nest during operation.

BRIEF DESCRIPTION OF THE DRAWINGS

FIG. 1 depicts in schematic cross-section a typical sputtering cathode known in the art;

FIG. 2 is a cross-sectional side view of an embodiment of the present invention;

FIG. 3 is a detail cross-section of a portion of an alternative embodiment of the invention;

DETAILED DESCRIPTION OF PREFERRED EMBODIMENTS

Figure 4:
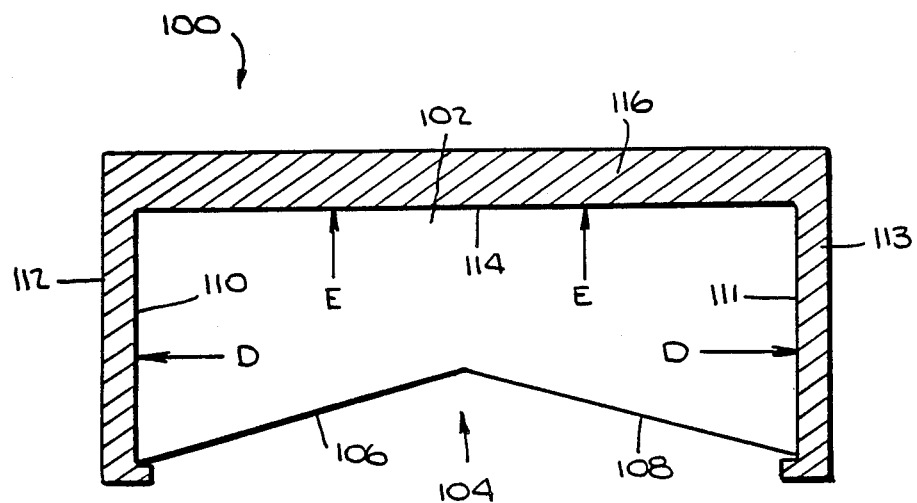
FIG. 4 is a schematic cross-sectional representation of another alternative embodiment of the invention.

Understanding of the present invention will be enhanced by a consideration of the prior art and the limitations inherent in conventional design. The sputtering cathode shown in FIG. 1 is typical of apparatus known in the art. There, cathode assembly 1 includes a circular target 2, carried on a plate 3 and surrounded by a side wall 4. A coolant passage 5 formed in the side wall provides for heat transfer during operation. A central retainer 6 holds the target in position within the assembly.

A newly-installed target rests within the cathode body as depicted—with the target bottom flat against the plate, and with some clearance (usually on the order of a few thousandths of an inch) between the target outer rim 8 and the interior of the side wall. During operation, the target temperature rises, creating expansive forces, as shown by arrows A. The target then expands, coming into contact with the cooled surface of the side wall. The plate 3 also offers a path for heat transfer, albeit a limited one, given the lack of forceful, intimate contact with a cooling surface.

For a relatively small cathode assembly, operated at relatively low power, the arrangement shown may provide sufficient cooling. It has been found, however, that this configuration proves deficient for larger, higher-power designs. In such a situation, especially when employing a target formed of relatively soft material, such as gold or aluminum, the cooling means of the prior art does not conduct away sufficient heat to prevent additional heat buildup within the target. Also, the size of the target becomes an important factor, as heat generated in the central portion of the target must travel to the target edge to be removed by the coolant.

Under such conditions, additional heat imposes additional expansive stresses; constrained at the outer periphery and the back face, and also constrained at the center by the retainer, the target expands in the direction of front face 7, buckling the target toward the shape shown by dotted line 11. Of course, as soon as the target buckles, the back face loses contact with plate 3, heat transfer through that path drops toward zero, and expansive forces against the cooled wall 4 are reduced (as the target outer rim displaces in response to the target distortion), exacerbating target heat buildup. In an extreme situation, the target temperature could exceed its melting point, leading to the loss of both the target and the material being coated, at substantial cost.

Moreover, the damage to the target is permanent. Given a relatively soft target material and high temperature, the target expansion takes the form of plastic, not elastic, flow. That is, the target does not return to its original shape but cools in the form it has assumed during operation. One would expect that subsequent operational cycles would only continue to extend the damage, and that expectation has been confirmed. Thus, it has been found that conventional designs do not permit operation at the cathode sizes and power requirements imposed by emerging design criteria.

Most important, these limitations are inherent in existing designs. Side wall cooling imposes clear limitations as target size increases, because heat at the center of the target cannot be extracted efficiently. Further, extant designs practically assure some degree of target distortion. If, as shown in FIG. 1, the target is constrained in three directions, it will respond as discussed above. If, as in some prior art designs, the center of the target is not restrained, the center will droop, progressively distorting the target shape on successive cycles. If the target is not restrained at the outer rim, that portion of the target will droop, similarly distorting the target shape. Whatever configuration the prior art employs, it cannot escape the consequences of the increased heat buildup imposed by larger target sizes and increased power requirements.

The present invention solves the problem of high power operation. FIG. 2 shows an embodiment of the invention, in which the cathode assembly 20 includes support structures, a cathode body 23, a cathode nest 24 and a target 26. The assembly as shown is generally cylindrical in form, adapted for the coating of circular substrates such as wafers used in the manufacture of microelectronic components. Those in the art will understand that other substrate forms will require alteration of the shape of the cathode assembly to provide an appropriate pattern of coating material atoms, and the present invention can be adapted readily to such circumstances.

The cathode assembly of the present invention can be positioned as desired within a sputtering chamber, with the target sputtering face oriented downward, upward, or horizontally. For the purpose of reference, the term "front" will hereinafter refer to the direction of the ion flux (the direction generally from the cathode assembly to the substrate), and the term "back" to the opposite direction.

The support structures associated with the cathode assembly constitute several distinct elements. A cap 22 forms the extreme back of the assembly, and is formed of a rigid, non-magnetic material, such as a strong aluminum alloy. This element provides structural strength to the assembly without affecting the magnetic field described below. Magnet means 38 are carried in a suitable cavity in the cap, and in the embodiment shown is a relatively flat, annular permanent magnet as known in the art. A central coolant passage cover 19, formed as a relatively thin annular member of non-magnetic material, lies at the forward face of the magnet means, coaxial with the cap. Conduits 30 and 32, received into opposite sides of the cap circumference, form side coolant inlet and outlet means, respectively, and similar conduits 34 and 36, received into circularly opposing points toward the center of the cap, form center coolant inlet and outlet means, respectively. Operation of the coolant system is explained in more detail below.

The cathode body 23 is a generally hollow cylindrical structure affixed to the outer periphery of the cap's front face, with side walls 28 extending outward from the cap and defining a central well. The cathode body is made up of a strong, ferromagnetic material, such as stainless steel, and plays a part in the cathode magnetic field. As known in the art, proper shaping of the cathode field is critical to controlling the erosion of coating material from the target. The cathode body includes lips 29, extending over the nest to the vicinity of the target. As the cathode body is a ferromagnetic material, the cathode body acts as a pole piece, with the lips concentrating the magnetic field lines to insure the optimum relationship between the field and the target.

Target nest 24 is received into the central well of the cathode body, and takes the form of a relatively flat, hollow cylinder with a closed back 25 and side walls 27 defining a central cavity. The back face of the nest conforms to the cathode body and support structures, with portions in engagement with the cap, the magnet means, and the retaining plate. Lips 29 at the forward end of the cathode body side walls retain the nest in position within the well. To support the central portion of the nest during operation (at which time the back of the nest is subjected to atmospheric pressure and the front face is subjected to the low pressures within the sputtering chamber), screw 39, extending frontward from the back face of the cap, engages stud 47 in the nest to maintain the nest in position. Stud 47 may be composed of a ferromagnetic material to form a pole piece to cooperate with the cathode body and the magnet means in shaping the magnetic field.

The nest, the cathode body and several elements of the support structure cooperate to form an efficient cooling system. Preferably, the nest is formed of a highly heat-conductive material, such as copper, to assist in heat transfer. Also, the embodiment shown provides two coolant systems, instead of relying on a single cooling passage in the side wall, as taught by the prior art. First a side wall coolant system is provided. Ribs 42 are formed in the outer periphery of the nest side wall, and when the nest side wall engages the inner side wall of the cathode body, the ribs and the cathode body side wall define passages 44 around the outer circumference of the nest, several such passages being in fluid communication with side coolant inlet 30 and outlet 32. Vertical slots (not shown) formed in the nest side wall connect the passages, permitting a flow of coolant around the periphery of the nest. A second coolant system serves the central portion of the nest. There, circular ribs 45 are formed in the central area of the nest back face, and, in engagement with the central coolant cover plate 19, central coolant passages 46 are defined. Severaly such passages are in fluid communication with central coolant inlet 34 and outlet 36, and slots (not shown) interconnect the passage to permit a flow of coolant at the center of the nest.

Those in the art will understand that the cooling means discussed above can be modified in various ways. For example, the dual cooling means disclosed could be combined into a single system serving both the side wall and the central area of the nest. Alternatively, a design could incorporate a sufficient thickness of heat-conductive material, such as copper, in the nest so that additional cooling means for the central portion of the nest were unnecessary. Thus, no matter what the means employed, a surface effective to provide significant cooling to the target will be a "cooling" surface as that term is used herein, whether or not that surface is directly "cooled".

Sputtering target 24 is received within the central cavity of the nest, and preferably is an annular disk having a cenral aperture 53. The front (sputtering) face of the target preferably forms a frusto-conical depression, but any target profile known in the art can be employed, as is most suitable for a particular cathode configuration. Retainer 54 fits into the target central aperture, attached to the nest by screws 56 or other suitable means, and this retainer forms a means for restraining heat-induced expansion of the sputtering target, as explained hereafter. A retainer shroud 58, attached to the upper surface of the retainer and extending over the retainer screws, prevents accumulation of coating material on same, facilitating the removal of the target. It should be noticed that the contact surface to between the target and the retainer is sloped, so that the end of the retainer bearing against the nest has a smaller diameter than does the opposite (forward) end. This profile eases the separation of the retainer from the target, inasmuch as the target inner rim tends to shrink inward, as explained below, and to press against the retainer.

The target outer rim and the nest inner wall incorporate additional cooling means, in the form of intermeshing projections and recesses. The general object of such means is to increase the surface area of contact between the nest and the target, to promote heat flow from the target to the nest. It is recognized that if the size and configuration of the projections and recesses is similar, as would be the case in a design selected to maximize the contact area, the terms "projection" and "recess" become arbitrary. Therefore, for reference purposes, those portions of this cooling means formed in the surface of the nest inner wall will be designated "projections", and those formed in the outer rim of the target "recesses", regardless of the actual dimensions of the particular elements chosen. It will be understood that designs wherein the elements formed in the target outer rim extend beyond the surface of same, and the elements formed in the nest inner wall extend into the surface of same; such designs fall within the terms employed herein.

Preferably, the target rim cooling means is a helical thread 50, complementarily formed in the target outer rim and the nest inner wall and extending the entire vertical length of the wall. This structure permits the target to be screwed into the nest, offering additional structural stability. To account for the expansion and contraction of the target during operation and cooling cycles, the thread should have sufficient depth to prevent the target outer rim from disengaging from the thread during cooling. It has been found that threads of a coarser pitch than about 20 threads per inch serve to retain the target in position. Such dimensions provide about 70–75% greater contact surface than does the conventional flat vertical side wall.

Those skilled in the art will appreciate that alternative configurations of this target/nest cooling means can be effective. For example, a rectangular cathode assembly could employ the present invention, using fins formed in the nest and received by conforming recesses in the target, or vice versa.

The back face of the sputtering target and the front face of the nest central cavity form complementary surfaces, convex with respect to the target. Preferably, the target back face includes two surfaces, as illustrated in FIG. 2: a planar surface 62, generally normal to the axis of the target, and a conical surface 64 sloping from the back of the target toward the front. These surfaces intersect to enclose an obtuse angle, the apex of which projects away from the target back face. An alternative approach, shown in FIG. 3, would form the target back face as a curved surface 66, convex to the target. It will become clear that any combination of surfaces having an arch-like shape, convex to the target, will produce the advantages of the invention, so that within the criterion that the face be convex, those in the art can elect to form the back face as a combination of planar, conical, curved, or other suitable surfaces, as desired.

Advantages of the invention emerge from a consideration of the operation of a cathode assembly constructed according to the principles outlined herein. A new sputtering target fits loosely within the nest, with a clearance of several thousandths of an inch between the target outer rim and the nest inner side wall 48, as well as between the target inner rim and the retainer 54. Further, the target back face 62, 64 generally bears against the front face of the nest central well, but the contact is neither forceful nor intimate. When operation is commenced, the target temperature rises, and the target begins to expand. Initially, the outer rim of the target moves outward, and the inner rim also increases in diameter. After the outer rim makes contact with the nest side wall, however, the target inner rim reverses direction and contracts, and continued expansion results in the inner rim eventually making contact with the retainer along surface 60. Thus, the nest side wall constitutes a first point at which expansive motion transverse to the cathode assembly axis is restrained, and the retainer constitutes a second point at which expansive transverse motion is restrained.

At this point the target is being cooled primarily through the side walls, assisted by the nest/target cooling means 50. Also, some cooling exists at the inner rim/retainer contact surface 60. High power operation, however, continues to add heat to the target, giving rise to additional expansive forces as shown by arrows B in FIG. 2. Inasmuch as the target is restrained from moving in a direction transverse to the assembly axis (Horizontally in FIG. 2), the target is placed in compression, generating stresses normal to the plane of the target, as shown by arrows C. In the prior art design, the planar form of the target back face resulted in the target's buckling, but the present invention's convex, arch-like design promotes controlled deformation, in the direction of the nest front face. Thus, the back face of the target undergoes a controlled plastic deformation toward a cooling surface, coming into intimate, forceful contact with same. Unlike the prior art, however, that surface is cooled by passages 46, and the forceful contact promotes heat transfer from the target to the coolant flowing in these passages. At the same time, the slope of surface 60 also urges the target back face into contact with the nest, further assisting the coolant process. It can be expected that the combination of controlled deformation, means for restraining transverse expansive motion and additional cooling surfaces adequately will cool targets up to 11 inches diameter, operating at power inputs up to 30 kW. These specifications compare very favorably with typical prior art devices, which generally are limited to diameters of 5-9 inches and power inputs of 5-12 kW.

It should be noted that the helical thread 50 provides an additional advantage during target cooling after operation. As described above, target heating results in an increase in the inner diameter of the target, followed, by a shrinking of that diameter. Post-operational cooling of the target, however, does not result in the outer rim returning to its original diameter; rather, a greater contraction occurs at the target outer rim's forward edge, resulting in a pattern of contractive forces that would tend to rotate the outer rim of the sputtering target inward, about a point in contact with the inner rim. Given conventional retaining means for the target edge, the target would droop at its periphery, that shape being accentuated over repeated cycles as the friction between the target outer rim and the nest prevented the target from expanding into contact with the nest front face. In the present invention, however, the helical thread holds the target in position between cycles, and the slopes of individual threads provide a ramping action as the target expands upon renewed operation, urging the target toward its original orientation and allowing the controlled deformation again to place the target into cooling contace with the nest.

An additional advantage of the present invention can be seen in comparing the targets of the prior art and the invention. The forward-sloping profile of the target back face permits a reduced volume for the target of the present invention, whether the design of FIG. 2 or FIG. 3 is considered. Given that targets generally are composed of very pure materials and often of precious metals, this savings in volume will be significant. Further, this reduction in material will not affect performance, as the general portion of the target generally is not eroded during sputtering, but is either discarded or recycled.

An alternative cathode assembly design 100 is schematically shown in FIG. 4. As seen, that assembly is generally formed in a rectangular configuration, with sputtering target 102 being also rectangular, having a front face 104 including two backwardly sloping portions 106, 108, defining an arch-like shape. Target sides 110, 111 are restrained from transverse expansive motion transverse to the target axis by two side walls 112, 113, and the relatively flat target back face 114 fits loosely against back wall 116. The side walls and and the back wall are cooled by appropriate means (not shown), and the target sides/side wall interfaces can be provided with imtermeshing recesses and projections to provide additional cooling.

During operation, this embodiment expands sideways, as shown by arrows D until the target sides make contact with and are restrained by the respective side walls. Continued heat accumulation results in the target undergoing plastic deformation, the direction of which is preselected by the shaping of the target front face, toward the back wall, as shown by arrow E. The back face is thus placed in intimate, forceful contact with that wall, facilitating cooling therefrom. Thus, this cathode assembly responds to high heating levels in the same controlled manner as does the circular embodiment shown in FIG. 2.

As wil be apparent to those in the art, various modifications and alterations can be made to the invention in adapting it to particular sputtering systems. For example, the shape of the target sputtering surface may be chosen from among a number of alternatives, based upon the cathode and magnet configurations. Similarly, the projection/recess cooling means in the target and nest can be implemented in a number of forms, such as vertically disposed fins or the like. These and other modifications can be made within the scope of the invention, which is defined solely by the claims appended hereto.

I claim:

1. A sputtering target assembly for a sputter coating apparatus, comprising:
   a target holder, having side walls defining a central cavity the inner periphery of said side walls having first cooling means formed therein for increasing the surface area of said side walls; and
   a target composed of coating material and formed to be received with said central cavity, said target having an outer rim having formed therein second cooling means for increasing the surface area of said rim to promote heat flow from said target to said target holder when said target is urged into intimate coupling contact with said target holder during heat induced expansion of said target, said second cooling means intermeshing with said first cooling means.

2. The sputtering target of claim 1, wherein said cooling means is a helical thread, complementarily formed in said side wall and said target outer rim.

3. The sputtering target of claim 1 or 2, wherein said target holder includes at least two cooled surfaces.

4. The sputtering target of claim 1, wherein the front face of said central cavity is formed to receive said target, and the the back face of said target is convex with respect to said target, whereby said back face undergoes a controlled deformation tranverse to the general plane of said target during heat-induced expansion.

5. The sputtering target of claim 4, wherein said back face includes a planar portion and a conical portion, said portions intersecting to enclosed an obtuse angle whose apex projects backwardly away from said target, and said central cavity includes surfaces complementary to said planar and conical portions.

6. The sputtering target of claim 4, wherein said back face includes a curved surface, convex to the body of the target, and said holder central cavity includes a curved surface complementary to said curved portion.

7. The sputtering target of claim 4, wherein said target is formed generally in a circular, annular form, and further comprising target retainer means for securing said target to said target holder.

8. A sputtering target and cathode assembly for a target which heats during operation and tends to expand when heated, said assembly comprising:
   an annular target having a central axis, a front face, a back face, an inner rim defining an inside target diameter, and an outer rim defining an outside target diameter, said target having an operating temperature, both of said rims having a tendency to expand away from said axis as said target is heated if said target is unrestrained;
   a rigid target holder having a target receiving cavity therein, a cylindrical side wall having an inside diameter which is nominally greater than said outside target diameter when the temperature of said target is below its operating temperature, but which is nominally equal to said outside target diameter when said target is heated to an elevated temperature less than its operating temperature, said side wall providing a first point of contact for restraining said target at said outer rim against thermal expansion transverse to and away from said axis during operational heating of said target above said elevated temperature;
   said target receiving cavity having interior cooling surfaces defining a shape complimentary to the back face and outer rim of said target, each of said surfaces having cooling means associated therewith;
   said target holder having an inner target retainer centered on said axis, said retainer having an outside diameter which is nominally less than the maximum inside diameter which said target will attain during heating of said target toward its operating temperature, said retainer providing a second point of contact for restraining said target at its inner rim against inward deformation when said target is heated to operating temperature while being restrained at its outer rim by said side wall;
   said target having a configuration to promote a controlled plastic deformation of said target in a direction transverse said axis when said target is being restrained against thermal expansion, said target configuration including a generally backwardly arch-like shape between its inner and outer rims such that the outer rim and back face of said target are urged in the direction of the respective complimentary cooling surfaces as the target thermally expands against said first point of contact and, when said target is heated above said elevated temperature, as the target plastically deforms inwardly, toward said axis, and against the second point of contact; and
   said target holder and said target configuration cooperating during the operational heating of said target to urge said target into intimate forceful cooling contact with said cooling surfaces at the outer rim and back face of said target and to promote a controlled plastic deformation of said target in said holder to permanently change the shape of the target so that it will conform, when subsequently heated to said operational temperature, to the shape of said target holder cavity interior cooling surfaces.

9. The sputtering target of claim 7 or 8, wherein said retainer includes an outer rim, with a back end disposed adjacent said target holder and a front end opposite same, said front end having a larger diameter than said back end, and said target having an inner rim formed complementarily to said outer rim of said retainer, whereby said target is urged into foreceful contact with said holder central cavity during heat-induced expansion.

10. The target assembly of claim 8 further comprising:
    a plurality of complimentary ridges in the outer rim of said target and on said side wall for increasing the thermal conductivity therebetween and for restraining said target in said holder.

11. The target assembly of claim 10 wherein said ridges are helical threads by which said target is insertable into, and is retained by, said holder before and during the operational heating of said target, and to prevent said outer rim from drooping from said wall when said target has cooled and contracted to an outer diameter of less than that of said side wall.

12. The target assembly of claim 8 wherein said front face is concave and said back face is convex.

13. The target of claim 8 wherein said controlled deformation is such as to result in a deformed shape which is thereafter retained upon the cooling of said target such that said outer rim shrinks from the side walls fo said holder upon cooling, and thereafter expands into contact with said side wall upon subsequent operational heating of said target.

14. A sputtering target for a sputter coating apparatus in which said apparatus has a rigid target holder for receiving an annular sputtering target having an inner rim, an outer rim and a back face, said holder having a side wall having means therein for restraining the expansion of said target outwardly from its axis and for retaining said target in said holder, said restraining and retaining means including a plurality of ridges formed in said side wall, said holder further having cooling surfaces shaped to conform to and contact a target at its outer rim and its back face and a center retainer to restrain a target against inward deformation at its inner rim, wherein:

said target has a back face, a front face, a circular outer rim engagable by said side wall, an inner rim engagable by said retainer and a central axis, said target being thicker at its outer rim than at its inner rim and having a plurality of ridges in said outer rim having a shape complimentary with the ridges on said holder to enhance the cooling surface between said target and said holder; and said target comprises means for promoting controlled plastic deformation of said target in a direction transverse to said target axis to permanently change the shape of the target, when heated, to conform to the cooling surfaces of the holder, which means includes a target configuration including an overall backwardly directed arch-like shape which at least one of said faces being of a backwardly directed arch-like shape from the target inner rim to the target outer rim, said plastic deformation promoting means being effective to urge the back face and outer rim of said target into intimate cooling contact against said holder during the operational heating of said target, and to direct plastic deformation of said target inwardly along said holder surfaces toward retainer when said target outer rim is restrained against said holder and said inner rim has expanded away from said retainer.

15. The target of claim 14 wherein the ridges on said holder side wall are internal helical threads and said ridges on said target are external helical threads for cooperating with the internal helical threads in the side wall to assist in restraining and retaining said target to said holder.

16. The sputtering cathode and target assembly according to claims 1 or 8 or 14, further comprising:

a cap having a central front face, said cap being formed of rigid, non-ferromagnetic material;

a cathode body, including side walls disposed at the outer periphery of said cap and defining a central well, said side walls having formed in the inner periphery thereof means for partially enclosing side cooling passages, said cathode body being formed of a strong, ferromagnetic material;

a central passage rear cover disposed at the central front face of said cap, said cover having a front face thereof having formed thereon means for partially enclosing central cooling passages;

coolant supply means in fluid communication with said side and central cooling passages;

magnet means carried within the assembly for inducing a cathode magnetic field;

said target holder being of high heat conductive material and received within said cathode body central well, the outer periphery of said side walls having means for partially enclosing side cooling passages in registration with said means for partially enclosing side passages formed in said inner periphery of said cathode body side walls to enclose, said side cooling passages therebetween, said target holding means having a back face having means formed therein for partially enclosing central cooling passages in registration with said means for partially enclosing central cooling passages formed in said central passage rear cover to enclose said central cooling passages therebetween, said side cooling passages being in mutual fluid communication and said central cooling passages being in mutual fluid communication.

17. The cathode and target assembly of claim 16, wherein said intermeshing cooling means is a helical thread, complementarily formed in said target holder side wall inner periphery and said target outer rim.

18. The cathode and target assembly of claim 16, wherein said intermeshing cooling means include projective cooling means extending from said target holder side wall inner periphery into said central cavity, and recess cooling means formed in said target outer rim, said projective cooling means and said recesses being complementarily formed for intermeshing cooling contact.

19. A sputtering target and cathode assembly comprising:

a target of sputtering material having a tendency to expand when subjected to operational heating and to permanently change in shape by plastically deforming in a predetermined direction if only partially restrained when heated, said target having an outer rim, a back face, and a backwardly arched cross-section to promote said plastic deformation in the predetermined direction;

a target holder having a target receiving cavity formed thereon and having a plurality of target restraining surfaces, including a side wall and a front face, bounding said cavity, said target holder being formed of rigid material so as to serve as a mold for material expanded therein;

said target being positioned in said cavity with said outer rim of said target adjacent said side wall of said target holder and with said target arched backwardly from said side wall toward said front face of said target holder;

said target undergoing operational heating due to the target power applied during operation so as to expand said target rim against said side wall restraining surface of said target holder so that said target is only partially restrained thereby and to further heat said target after it is so restrained;

to compress said target into said cavity to plastically deform said target in said predetermined direction whereby said target back face arches toward and against said front face of said holder to permanently change the target shape so as to mold said target to conform it to the surfaces of said cavity when subsequently reheated.

20. The assembly of claim 19 wherein said target is annular.

* * * * *